United States Patent
Lin et al.

(10) Patent No.: US 6,175,475 B1
(45) Date of Patent: *Jan. 16, 2001

(54) FULLY-PINNED, FLUX-CLOSED SPIN VALVE

(75) Inventors: Tsann Lin, Saratoga; Daniele Mauri, San Jose; Joseph Francis Smyth, Los Altos; Ching Hwa Tsang, Sunnyvale, all of CA (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/085,654

(22) Filed: May 27, 1998

(51) Int. Cl.$^7$ .................................................. G11B 5/39
(52) U.S. Cl. ................................................. 360/324.11
(58) Field of Search .................................. 360/113, 324, 360/324.1, 324.11, 324.12; 324/252, 207.21; 338/32 R, 32 H

(56) References Cited

U.S. PATENT DOCUMENTS

| | | | |
|---|---|---|---|
| 5,159,513 | 10/1992 | Dieny et al. | 360/113 |
| 5,206,590 | 4/1993 | Dieny et al. | 324/252 |
| 5,465,185 | 11/1995 | Heim et al. | 360/113 |
| 5,508,867 | 4/1996 | Cain et al. | 360/113 |
| 5,701,222 | * 12/1997 | Gill et al. | 360/113 |
| 5,705,973 | * 1/1998 | Yuan et al. | 360/113 |
| 5,768,066 | * 6/1998 | Akiyama et al. | 360/113 |
| 5,796,561 | * 8/1998 | Mauri | 360/113 |

* cited by examiner

*Primary Examiner*—David L. Ometz
(74) *Attorney, Agent, or Firm*—William D. Gill

(57) ABSTRACT

A fully-pinned, flux-closed spin valve (SV) magnetoresistive sensor having a reference (pinned) layer with magnetization fixed by a first antiferromagnetic (AFM1) layer, and a keeper layer with magnetization fixed by a second antiferromagnetic (AFM2) layer. The magnetization of the keeper layer is saturated and fixed in an antiparallel orientation to the pinned layer magnetization by an exchange interaction with the AFM2 layer. The magnetic moments of the pinned layer and the keeper layer are approximately matched to form a flux-closed magnetic configuration wherein demagnetizing fields in the pinned layer are largely canceled and magnetostatic interaction with the free layer is reduced. Saturation of the keeper layer magnetization by exchange coupling with the AFM2 layer eliminates or reduces magnetization canting at the edges of the keeper layer which can result in signal field shunting through the keeper layer. AFM1 and AFM2 layers may be formed of the same antiferromagnetic material, such as NiO, or alternatively may be formed of different antiferromagnetic materials, such as Ni—Mn and NiO, respectively.

35 Claims, 5 Drawing Sheets

FULLY-PINNED, FLUX-CLOSED SPIN VALVE

BACKGROUND OF THE INVENTION

1. Field of the Invention

This invention relates in general to spin valve magnetic transducers for reading information signals from a magnetic medium and, in particular, to a spin valve sensor with a pinned keeper layer, and to magnetic storage systems which incorporate such sensors.

2. Description of Related Art

Computers often include auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive (MR) read sensors, commonly referred to as MR sensors, are the prevailing read sensors because of their capability to read data from a surface of a disk at greater track and linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization in the MR element and the direction of sense current flowing through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers.

GMR sensors using only two layers of ferromagnetic material (e.g., Ni—Fe) separated by a layer of non-magnetic material (e.g., copper) are generally referred to as spin valve (SV) sensors manifesting the SV effect. In an SV sensor, one of the ferromagnetic layers, referred to as the pinned layer (reference layer), has its magnetization typically pinned by exchange coupling with an antiferromagnetic (e.g., NiO or Fe—Mn) layer. The pinning field generated by the antiferromagnetic layer should be greater than demagnetizing fields (about 200 Oe) at the operating temperature of the SV sensor (about 120 C.) to ensure that the magnetization direction of the pinned layer remains fixed during the application of external fields (e.g., fields from bits recorded on the disk). The magnetization of the other ferromagnetic layer, referred to as the free layer, however, is not fixed and is free to rotate in response to the field from the recorded magnetic medium (the signal field). In the SV sensor, the SV effect varies as the cosine of the angle between the magnetization of the pinned layer and the magnetization of the free layer. Recorded data can be read from a magnetic medium because the external magnetic field from the recorded magnetic medium (the signal field) causes a change in direction of magnetization in the free layer, which in turn causes a change in resistance of the SV sensor and a corresponding change in the sensed current or voltage. IBM's U.S. Pat. No. 5,206,590 granted to Dieny et al., incorporated herein by reference, discloses a GMR sensor operating on the basis of the SV effect.

FIG. 1 shows a prior art SV sensor 100 comprising a free layer (free ferromagnetic layer) 110 separated from a pinned layer (pinned ferromagnetic layer) 120 by a non-magnetic, electrically-conducting spacer layer 115. The magnetization of the pinned layer 120 is fixed by an antiferromagnetic (AFM) layer 130.

FIG. 2a shows another prior art SV sensor 200 with a flux keepered configuration. SV sensor 200 is substantially identical to the SV sensor 100 shown in FIG. 1 except for the addition of a keeper layer 206 formed of ferromagnetic material separated from the free layer 110 by a non-magnetic, spacer layer 208. The keeper layer 206 provides a flux closure path for the magnetic field from the pinned layer 120 resulting in easier pinned layer saturation and reduced magnetostatic interaction of the pinned layer 120 with the free layer 110. U.S. Pat. No. 5,508,867 granted to Cain et al., incorporated herein by reference, discloses an SV sensor having a flux keepered configuration.

FIG. 2b shows a perspective view of the SV sensor 200. This view shows the multilayer structure of SV sensor 200 as a ribbon-like sheet (stripe) extending away (downward in FIG. 2b) from the air-bearing surface (ABS). The keeper layer 206 is formed as a keeper layer stripe 260 having a front edge 270 at the ABS and extending away from the ABS to a rear edge 272. In SV sensors having a flux keepered configuration, the keeper layer 206 maintains its magnetization due to magnetostatic interaction with the pinned layer and to sense current induced fields. These forces are generally sufficient to properly orient the magnetization of a central portion 280 of the keeper layer stripe 260 as indicated by arrows 282, but usually leave a substantial region at the front and rear edges 270, 272 of the keeper layer stripe 260 with magnetization canted relative to the central portion 280 as indicated by arrows 274, 276. This means that only the central portion of the keeper layer stripe is providing flux keepering. In order to completely cancel the pinned layer moment a thicker keeper layer must be used. The thicker keeper layer increases the amount of sense current shunted through the keeper reducing the magnetoresistance signal. The magnetization in the canted regions at the front and rear edges 270, 272 of the keeper layer stripe 260 can also rotate in the presence of a signal field, thus shunting flux away from the free layer 110 resulting in a smaller detected signal.

Therefore there is a need for an SV sensor that provides improved orientation of the magnetization of the keeper layer in order to enhance the effectiveness of the keeper layer to form a flux closure path for the pinned layer magnetization.

SUMMARY OF THE INVENTION

It is an object of the present invention to disclose a keepered SV sensor with improved orientation of the magnetization of the keeper layer.

It is another object of the present invention to disclose a keepered SV sensor wherein the magnetization direction of the keeper layer is fixed (pinned) by an exchange interaction with an antiferromnagnetic (AFM) layer.

It is a further object of the present invention to disclose a keepered SV sensor wherein the magnetic moments of the pinned layer and the keeper layer may be closely matched while still having a predictable GMR signal polarity.

In accordance with the principles of the present invention, there is disclosed a preferred embodiment wherein an SV sensor has a pinned layer with its direction of magnetization fixed (pinned) by exchange coupling with a first AFM layer, and a keeper layer formed of ferromagnetic material with its direction of magnetization fixed (pinned) by exchange coupling with a second AFM layer. An electrically conducting spacer layer, a ferromagnetic free layer and a non-magnetic, low conductivity spacer layer are disposed between the pinned layer and the keeper layer. The directions of magnetization of the pinned layer and the keeper layer are fixed in an antiparallel orientation with respect to each other in order to reduce or cancel their net magnetic moment. Pinning of the keeper layer by exchange coupling with an AFM layer results in fully saturated keeper layer magnetization in the transverse direction, eliminating or substantially reducing canting of the magnetization at the keeper layer edges. Having saturated keeper layer magnetization allows a thinner keeper layer to provide the magnetic moment needed to cancel the magnetic moment of the pinned layer. Saturation of the magnetization of the keeper layer also results in decreased shunting of the signal field through the keeper layer.

The first and second AFM layers used to fix the magnetization of the pinned and keeper layers, respectively, may be formed of the same material, for example NiO, and the proper magnetic state may be achieved by pulsed current initialization, or alternatively, the AFM layers may be formed of different materials and the proper magnetic states may be set at different temperatures for each AFM material. Sense current shunting by the first and second AFM layers is reduced by using high electrical resistivity AFM materials to form both layers.

The above, as well as additional objects, features, and advantages of the present invention will become apparent in the following detailed written description.

BRIEF DESCRIPTION OF THE DRAWINGS

For a fuller understanding of the nature and advantages of the present invention, as well as the preferred mode of use, reference should be made to the following detailed description read in conjunction with the accompanying drawings. In the following drawings, like reference numerals designate like or similar parts throughout the drawings.

DETAILED DESCRIPTION OF THE PREFERRED EMBODIMENT

The following description is the best embodiment presently contemplated for carrying out the present invention. This description is made for the purpose of illustrating the general principles of the present invention and is not meant to limit the inventive concepts claimed herein.

Figure 1:
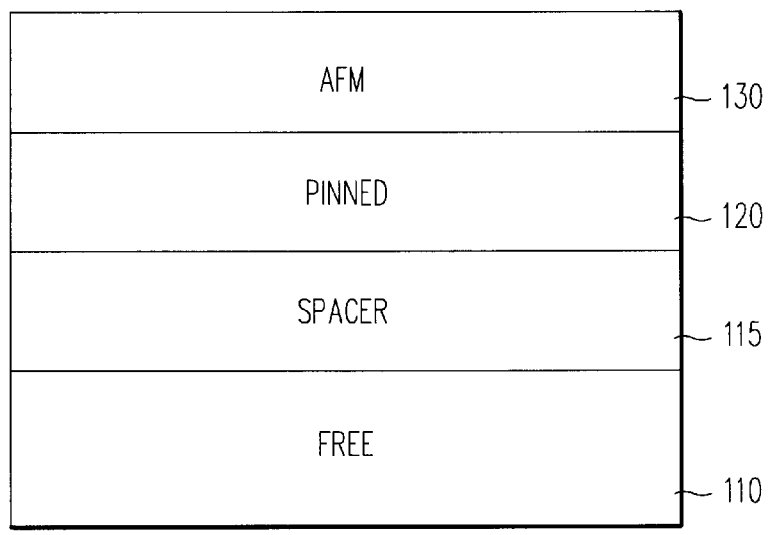
FIG. 1 is an air bearing surface view, not to scale, of a prior art SV sensor.
Figure 2A:
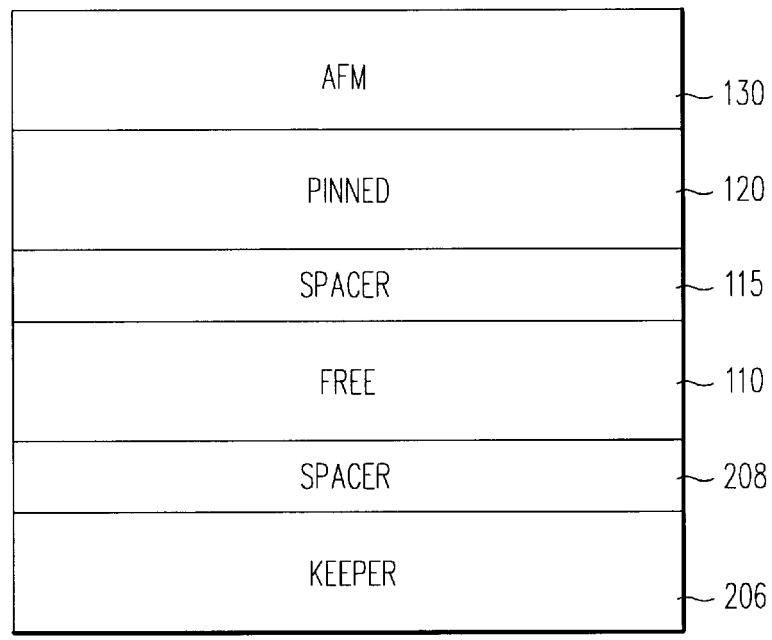
FIG. 2a is an air bearing surface view, not to scale, of a prior art keepered SV sensor.
Figure 2B:
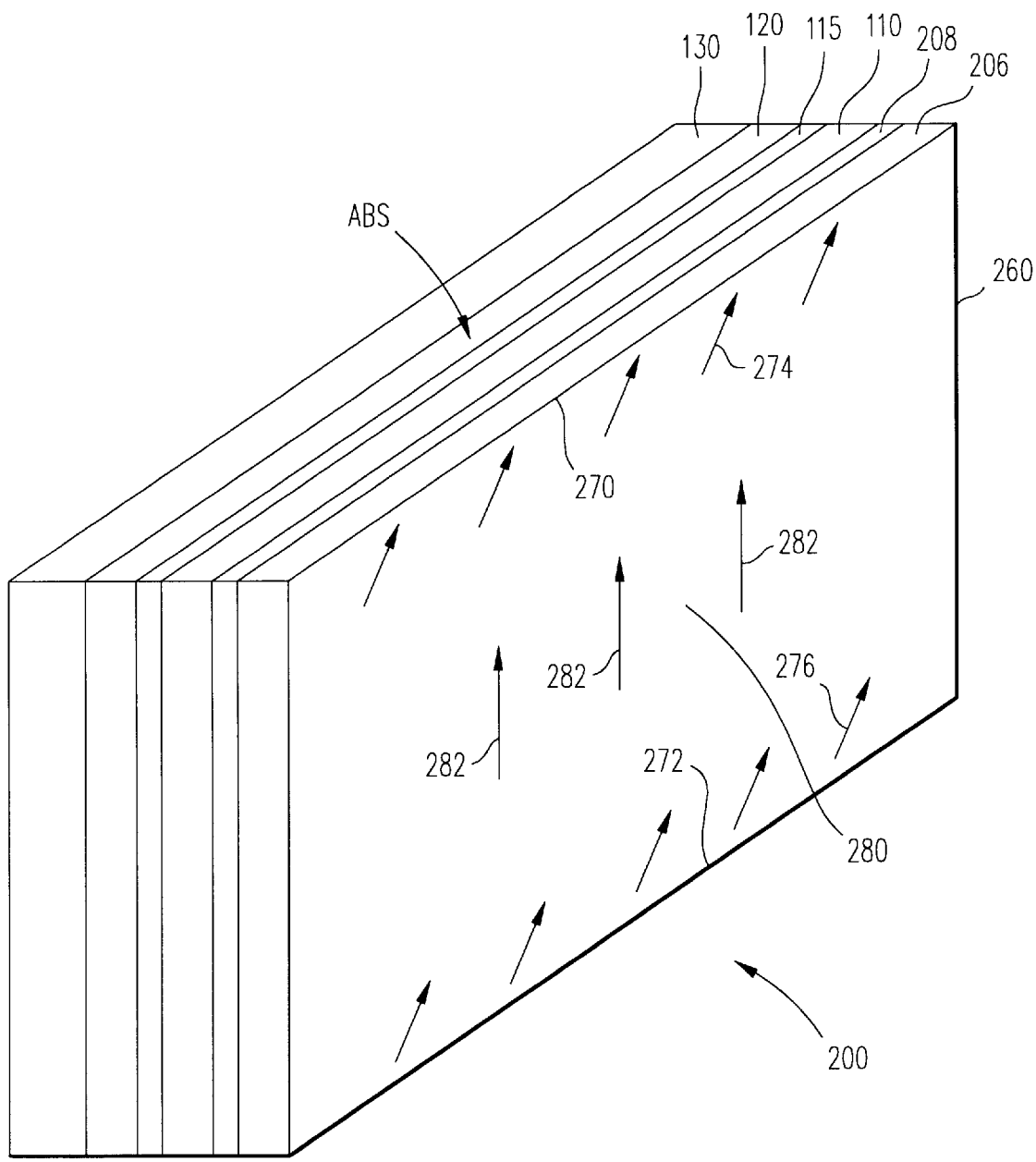
FIG. 2b is a perspective view, not to scale, of a prior art keepered SV sensor.
Figure 3:
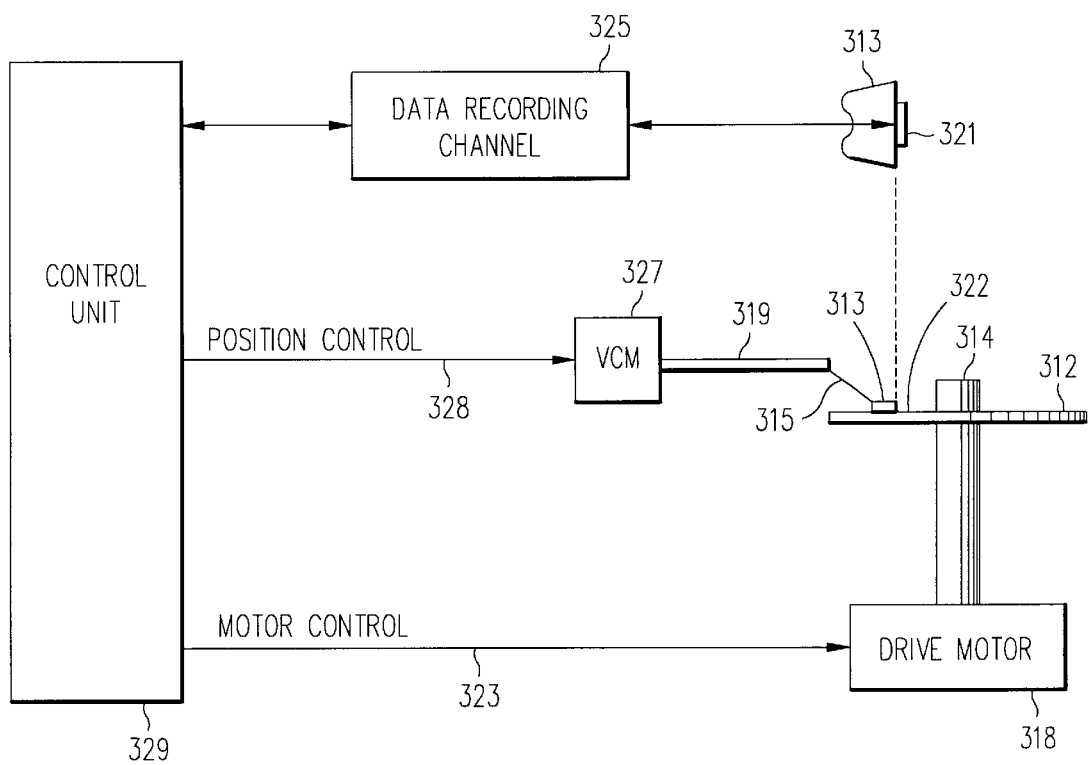
FIG. 3 is a simplified drawing of a magnetic recording disk drive system.

Referring now to FIG. 3, there is shown a disk drive 300 embodying the present invention. As shown in FIG. 3, at least one rotatable magnetic disk 312 is supported on a spindle 314 and rotated by a disk drive motor 318. The magnetic recording media on each disk is in the form of an annular pattern of concentric data tracks (not shown) on the disk 312.

At least one slider 313 is positioned on the disk 312, each slider 313 supporting one or more magnetic read/write heads 321 where the head 321 incorporates the MR sensor of the present invention. As the disks rotate, the slider 313 is moved radially in and out over the disk surface 322 so that the heads 321 may access different portions of the disk where desired data is recorded. Each slider 313 is attached to an actuator arm 319 by means of a suspension 315. The suspension 315 provides a slight spring force which biases the slider 313 against the disk surface 322. Each actuator arm 319 is attached to an actuator means 327. The actuator means as shown in FIG. 3 may be a voice coil motor (VCM). The VCM comprises a coil movable within a fixed magnetic field, the direction and speed of the coil movements being controlled by the motor current signals supplied by a controller 329.

During operation of the disk storage system, the rotation of the disk 312 generates an air bearing between the slider 313 (the surface of the slider 313 which includes the head 321 and faces the surface of the disk 312 is referred to as an air bearing surface (ABS)) and the disk surface 322 which exerts an upward force or lift on the slider. The air bearing thus counter-balances the slight spring force of the suspension 315 and supports the slider 313 off and slightly above the disk surface by a small, substantially constant spacing during normal operation.

The various components of the disk storage system are controlled in operation by control signals generated by the controller 329, such as access control signals and internal clock signals. Typically, controller 329 comprises logic control circuits, storage means and a microprocessor. The controller 329 generates control signals to control various system operations such as drive motor control signals on a line 323 and head position and seek control signals on a line 328. The control signals on the line 328 provide the desired current profiles to optimally move and position the slider 313 to the desired data track on the disk 312. Read and write signals are communicated to and from read/write heads 321 by means of a recording channel 325.

The above description of a typical magnetic disk storage system, and the accompanying illustration of FIG. 3 are for representation purposes only. It should be apparent that disk storage systems may contain a large number of disks and actuators, and each actuator may support a number of sliders.

Figure 4:
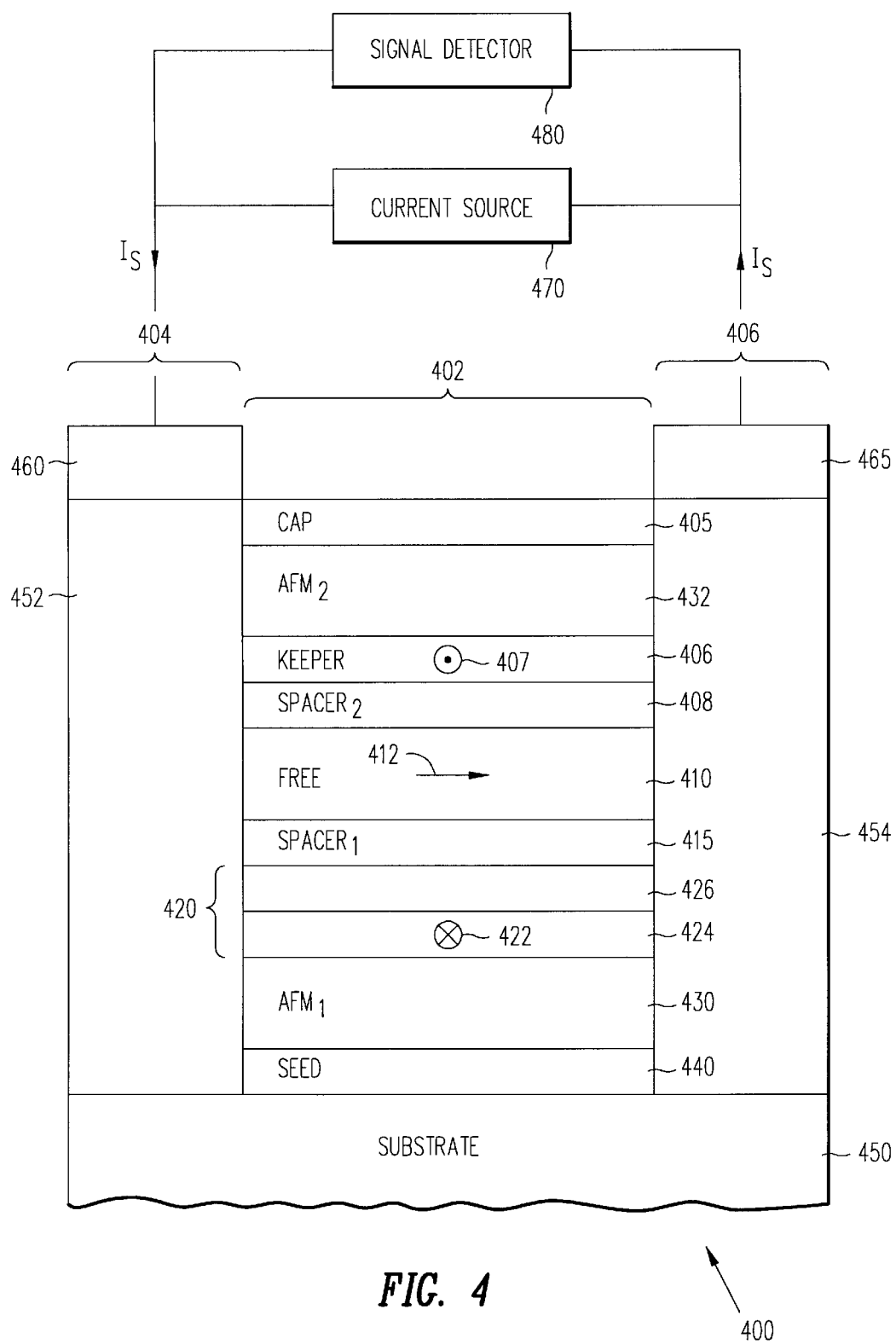
FIG. 4 is an air bearing surface view, not to scale, of the preferred embodiment of an SV sensor according to the present invention.

FIG. 4 shows an air bearing surface (ABS) view of an SV sensor 400 according to the preferred embodiment of the present invention. The SV sensor 400 comprises end regions 404 and 406 separated from each other by a central region 402. The substrate 450 can be any suitable substance, including glass, semiconductor material, or a ceramic material, such as alumina ($Al_2O_3$). The seed layer 440 is a layer deposited to modify the crystallographic texture or grain size of the subsequent layers, and may not be needed depending on the substrate and AFM materials. If used, the seed layer may be formed of tantulum (Ta), zirconium (Zr), nickel-iron (Ni—Fe), or $Al_2O_3$. In the preferred embodiment, the first AFM (AFM1) layer 430 is formed of nickel-oxide (NiO) and is deposited directly over the substrate 450 by ion beam sputtering a nickel (Ni) target in the presence of an oxygen-containing gas to the thickness at which the desired exchange properties are achieved, typically in the range from 200 Å to 500 Å. A laminated pinned layer 420 comprising a second sublayer 424 formed of Ni—Fe (permalloy) having a thickness of about 20 Å deposited on the AFM1 layer 430, and a first sublayer 426 formed of cobalt (Co), or alternatively of Co—Fe, having a thickness of about 25 Å deposited over the second sublayer 424. A first spacer (spacer1) layer 415 formed of copper (Cu) having a thickness of about 20 Å is deposited on the laminated pinned layer 420. A free layer 410 formed of Ni—Fe having a thickness of about 55 Å is deposited on the spacer1 layer 415. A second spacer (spacer2) layer 408 formed of a tantalum (Ta) film having a thickness of about 50 Å deposited on the free layer 410 separates the free layer 410 from a keeper layer 406 formed of a Ni—Fe—Cr film having a thickness in the range from 50 Å to 100 Å. The spacer2 layer 408 is made of a non-magnetic, high electrical resistivity material to provide magnetic isolation of the keeper layer 406 from the free layer 410. A second AFM (AFM2) layer 432 formed of NiO having a thickness in a range from 200 Å to 500 Å is deposited on the keeper layer 406. A cap layer 405 formed of a tantalum (Ta) film having a thickness of about 50 Å completes the structure of the central portion 402 of the SV sensor 400.

After deposition of the layers forming the central portion 402, the SV sensor 400 was annealed in a high vacuum oven for 20 minutes at 200° C. with a magnetic field applied in a transverse direction (perpendicular to and away from the ABS) to set the direction of the exchange interaction of the pinned and keeper layers with the AFM1 and AFM2 layers, respectively.

After annealing, bias layers 452 and 454 are formed in the end regions 404 and 406, respectively, for providing a longitudinal bias field to the free layer 410 to ensure a single magnetic domain state in the free layer oriented in the direction indicated by arrow 412. Lead layers 460 and 465 are also deposited in the end regions 404 and 406, respectively, to provide electrical connections for the flow of the sensing current $I_s$ from a current source 470 to the SV sensor 400. A signal detector 480, which is electrically connected to leads 460 and 465, senses the change in the resistance due to changes induced in the free layer 410 by the external magnetic field (e.g., field generated by a data bit stored on a disk). The external magnetic field acts to rotate the direction of magnetization of the free layer 410 relative to the direction of magnetization of the pinned layer 420 which is preferably pinned perpendicular to the ABS. The signal detector 480 preferably includes a digital recording channel such as a PRML channel as is known to those skilled in the art. The signal detector 480 also includes other supporting circuitries such as a preamplifier (electrically placed between the sensor and the channel) for conditioning the sensed resistance changes as is known to those skilled in the art.

After the fabrication process of SV sensor 400, the magnetizations of the pinned layer 420 and the keeper layer 406 are oriented perpendicular to and away from the ABS. To form the fully-pinned, flux closed configuration of the present invention, the magnetizations of the pinned layer 420 and the keeper layer 406 must be fixed in an antiparallel orientation by an initialization process. A current pulse is applied by the sense current source to the SV sensor 400. The current pulse resistively heats the SV sensor 400 causing the temperature of the AFM1 and AFM2 layers to exceed the blocking temperature (temperature at which the AFM pinning field reaches zero Oe) of NiO (approximately 220° C.). The applied current pulse also induces magnetic fields in the pinned layer 420 and the keeper layer 406 directed perpendicular to the ABS. Since most of the current pulse flows through the spacer1 and free layers, 415 and 410, respectively, which lie between the pinned layer 420 and the keeper layer 406 the current pulse induced magnetizations of the pinned layer 420 and the keeper layer 406 are antiparallel as indicated by arrows 407 and 422, respectively (arrow heads directed into and out of the plane of the paper, respectively). When the current pulse is removed, the SV sensor 400 cools below the NiO blocking temperature leaving the pinned and keeper layer magnetizations fixed in the desired antiparallel fully-pinned, flux-closed orientation.

Alternative AFM materials for the AFM1 layer 430 or the AFM2 layer 432 such as Fe—Mn, Pd—Mn, Pt—Mn, Pd—Pt—Mn, Ir—Mn, Rh—Mn, and Ru—Mn may also be used to fabricate SV sensors according to the present invention. However, the use of electrically insulating AFM materials, such as NiO or $\alpha$—$Fe_2O_3$, is advantageous in reducing sense current shunting through the AFM1 and AFM2 layers.

Alternative spacer1 layer 415 materials such as gold and silver, and alternative spacer2 layer 408 materials such as tantalum oxide, $Al_2O_3$ and $SiO_2$ may also be used to fabricate SV sensors according to the present invention.

Alternative keeper layer 406 materials such as Ni—Fe—Nb, Ni—Fe—Rh, Ni—Fe, Co—Fe—Nb, Co—Fe—Nb—Hf, Co—Zr—Mo, Fe—Hf—N, Fe—Y—N Fe—Zr—N, Fe—Hf—O, Fe—Y—O and Fe—Zr—O may be used to fabricate SV sensors according to the present invention.

Having the AFM2 layer fixing (pinning) the magnetization of the keeper layer 406 by exchange pinning results in a predictable and stable magnetization configuration providing optimum flux closure for the SV sensor 400. With a pinned keeper layer, the magnetization of the keeper layer 406 is saturated in the desired antiparallel direction to the magnetization of the pinned layer 420, greatly reducing or eliminating canting of the magnetization direction at the keeper layer 406 edges. The improved and predictable keeper layer magnetization improves consistency in achieving nearly zero net magnetic moment of the pinned and keeper layers and allows a keeper layer having reduced thickness to be used. Achieving near zero net magnetic moment will improve SV sensor performance by reducing demagnetizing fields in the pinned layer 420 and by reducing magnetostatic coupling of the pinned and keeper layers 420, 407 to the free layer 410. For optimum SV sensor biasing, it is preferred to have the keeper layer magnetic moment slightly larger than the pinned layer magnetic moment in order to compensate for the sense current induced bias field.

Saturation of the keeper layer 406 magnetization by exchange interaction with the AFM2 layer 432 reduces the permeability of the keeper layer 406 resulting in reduced signal magnetic flux shunting from the free layer 410 through the keeper layer 406. Reduced shunting of the signal magnetic flux will increase the sensitivity of SV sensor 400.

Figure 5:
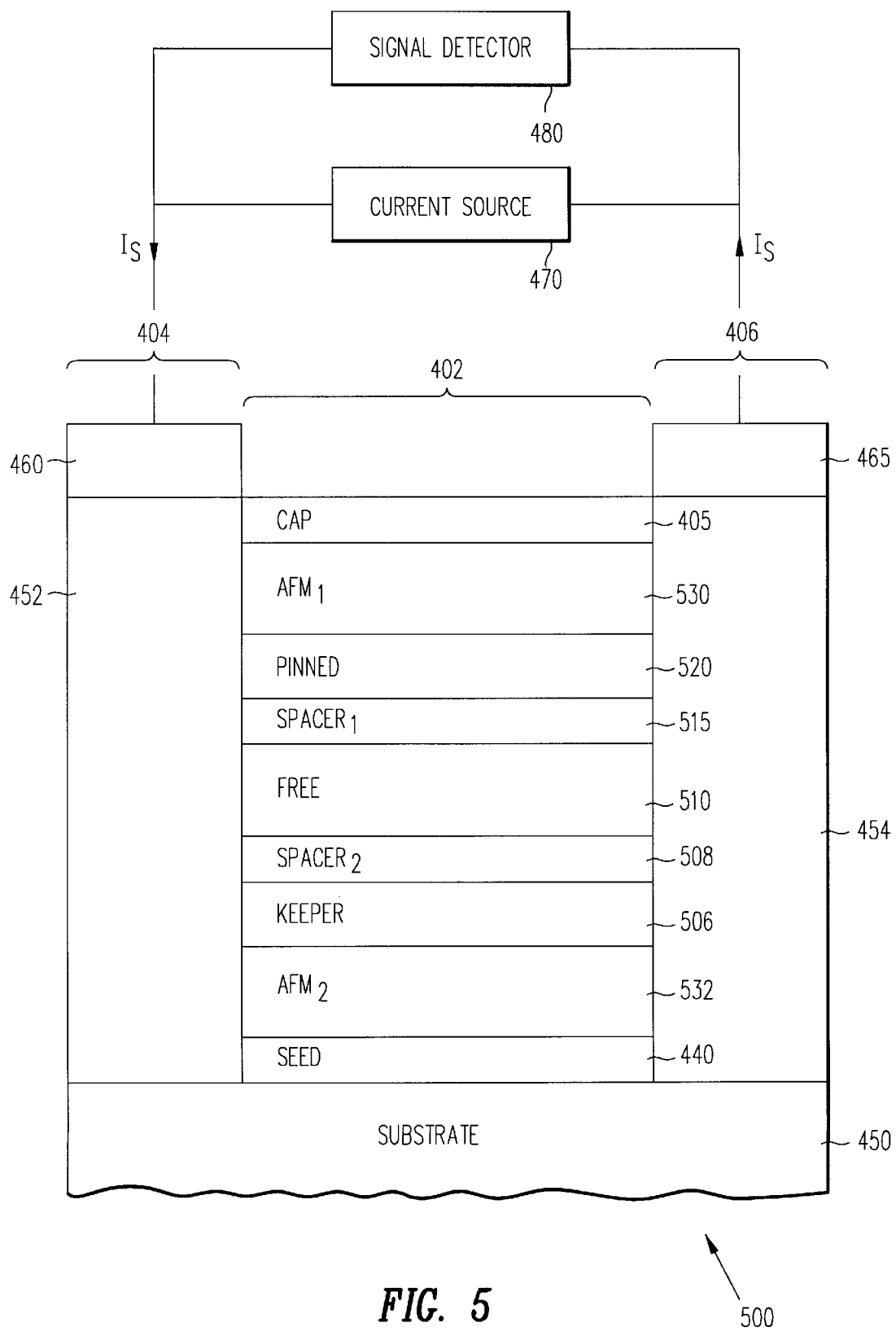
FIG. 5 is an air bearing surface view, not to scale, of an alternate embodiment of an SV sensor according to the present invention.

FIG. 5 shows an air bearing surface (ABS) view of an SV sensor 500 according to an alternate embodiment of the present invention. In this embodiment, the second AFM (AFM2) layer 532 is formed of nickel-oxide (NiO) having a thickness in a range from 200 Å to 400 Å deposited directly onto the substrate 450.

A keeper layer 506 formed of Ni—Fe—Cr having a thickness of in a range from 50 Å to 100 Å is formed on the AFM2 layer 532. A second spacer (spacer2) layer 508 formed of Ta having a thickness of about 50 Å is deposited on the keeper layer 506. The spacer2 layer 508 is a non-magnetic, high electrical resistivity material layer separating the keeper layer 506 from a free layer 510 formed of Ni—Fe having a thickness of about 55 Å. A first spacer (spacer1) layer 515 formed of a copper (Cu) film having a thickness of about 20 Å is deposited on the free layer 510 and a pinned layer 520 formed of a cobalt (Co) film having a thickness in a range from 20 Å to 50 Å is deposited on the spacer1 layer 515. An AFM1 layer 530 formed of Ni—Mn having a thickness in the range from 100 Å to 400 Å is deposited on the pinned layer 520. The preferred composition of the Ni—Mn AFM layer is a Mn content in the range between 46 and 60 atomic percent. A cap layer 405 formed of a tantalum (Ta) film having a thickness of about 50 Å completes the structure of the central portion 402 of the SV sensor 500.

After deposition of the layers forming the central portion 402, the SV sensor 500 was annealed in a high vacuum oven for 2 hours at 280° C. with a magnetic field applied in a transverse direction (perpendicular to and toward the ABS) to set the direction of the exchange interaction of the pinned layer with the Ni—Mn AFM1 layer.

After the fabrication process of SV sensor 500, the magnetizations of the pinned layer 520 and the keeper layer 506 are oriented perpendicular to and toward the ABS. An initialization process is needed to set the magnetization direction of the keeper layer 506 antiparallel to the magnetization direction of the pinned layer 520. Since the AFM2 layer 532 has a lower blocking temperature than the AFML layer 530, the initialization can be done by a low temperature anneal process (200° C. for 20 minutes) in an orienting magnetic field of about 100 Oe to cause the NiO AFM2 layer to exceed its blocking temperature resulting in reorientation of the magnetization of the keeper layer 506 perpendicular to and away from the ABS.

While the present invention has been particularly shown and described with reference to the preferred embodiments, it will be understood by those skilled in the art that various changes in form and detail may be made without departing from the spirit, scope and teaching of the invention. Accordingly, the disclosed invention is to be considered merely as illustrative and limited in scope only as specified in the appended claims.

We claim:

1. A spin valve (SV) magnetoresistive sensor, comprising:
   a first antiferromagnetic (AFM1) layer;
   a pinned layer adjacent to said AFM1 layer, said AFM1 layer pinning the magnetization of said pinned layer;
   a free layer of ferromagnetic material, wherein said free layer is the only free layer;
   a first spacer (spacer1) layer disposed between said free layer and said pinned layer;
   a keeper layer of ferromagnetic material;
   a second spacer (spacer2) layer of non-magnetic high electrical resistivity material disposed between said free layer and said keeper layer; and
   a second antiferromagnetic (AFM2) layer adjacent to said keeper layer, said AFM2 layer pinning the magnetization of said keeper layer.

2. The SV sensor as recited in claim 1, wherein said AFM1 layer is made from NiO.

3. The SV sensor as recited in claim 1, wherein said AFM2 layer is made from NiO.

4. The SV sensor as recited in claim 1, wherein said keeper layer is made from Ni—Fe—Cr.

5. The SV sensor as recited in claim 1, wherein said keeper layer is selected from a group of materials consisting of Ni—Fe—Nb, Ni—Fe—Rh, Ni—Fe, Co—Fe—Nb, Co—Fe—Nb—Hf, Co—Zr—Mo, Fe—Hf—N, Fe—Y—N, Fe—Zr—N, Fe—Hf—C, Fe—Y—C, and Fe—Zr—O.

6. The SV sensor as recited in claim 1, wherein said spacer2 layer is selected from a group of materials consisting of Ta, tantalum oxide, $Al_2O_3$, and $SiO_2$.

7. The SV sensor as recited in claim 1, wherein said pinned layer further comprises:
   a first sub-layer made of cobalt or Co—Fe adjacent to said spacer1 layer; and
   a second sub-layer made of Ni—Fe (permalloy) adjacent to said first sub-layer.

8. The SV sensor as recited in claim 1, wherein said spacer1 layer is selected from a group of materials consisting of copper, gold and silver.

9. The SV sensor as recited in claim 1, wherein said pinned layer is selected from a group of materials including Ni—Fe and Ni—Fe—Co.

10. The SV sensor as recited in claim 1, wherein said free layer is made of Ni—Fe.

11. The SV sensor as recited in claim 1, wherein said AFM1 layer is made of $Ni_x$—$Mn_y$ where $40\% \leq x \leq 54\%$, $46\% \leq y \leq 60\%$, and $x+y=100\%$.

12. The SV sensor as recited in claim 1, wherein said AFM1 layer is selected from a group of materials including Fe—Mn, Pd—Mn, Pt—Mn, Pd—Pt—Mn, Ir—Mn, Rh—Mn, Ru—Mn and Cr—Mn—Pt.

13. The SV sensor as recited in claim 1, wherein said AFM2 layer is selected from a group of materials including Ni—Mn, Fe—Mn, Pd—Mn, Pt—Mn, Pd—Pt—Mn, Ir—Mn, Rh—Mn, Ru—Mn and Cr—Mn—Pt.

14. A spin valve (SV) magnetoresistive sensor, comprising:
   a first antiferromagnetic (AFM1) layer of NiO;
   a pinned layer adjacent to said AFM1 layer, said AFM1 layer pinning the magnetization of said pinned layer;
   a free layer of ferromagnetic material, wherein said free layer is the only free layer;
   a spacer1 layer disposed between said free layer and said pinned layer;
   a keeper layer of ferromagnetic material;
   a spacer2 layer of non-magnetic high electrical resistivity material disposed between said free layer and said keeper layer; and
   a second antiferromagnetic (AFM2) layer of NiO adjacent to said keeper layer, said AFM2 layer pinning the magnetization of said keeper layer.

15. The SV sensor as recited in claim 14, wherein said keeper layer is made from Ni—Fe—Cr.

16. The SV sensor as recited in claim 14, wherein said spacer2 layer is selected from a group of materials consisting of Ta, tantalum oxide, $Al_2O_3$, and $SiO_2$.

17. The SV sensor as recited in claim 14, wherein said pinned layer further comprises:
   a first sub-layer made of cobalt or Co—Fe adjacent to said spacer1 layer; and
   a second sub-layer made of Ni—Fe (permalloy) adjacent to said first sub-layer.

18. The SV sensor as recited in claim 14, wherein said spacer1 layer is selected from a group of materials consisting of copper, gold and silver.

19. The SV sensor as recited in claim 14, wherein said pinned layer is selected from a group of materials including Ni—Fe and Ni—Fe—Co.

20. The SV sensor as recited in claim 14, wherein said free layer is made of Ni—Fe.

21. A spin valve (SV) magnetoresistive sensor, comprising:
   a first antiferromagnetic (AFM1) layer of Ni—Mn;
   a pinned layer adjacent to said AFM1 layer, said AFM1 layer pinning the magnetization of said pinned layer;
   a free layer of ferromagnetic material, wherein said free layer is the only free layer;
   a spacer1 layer disposed between said free layer and said pinned layer;
   a keeper layer of ferromagnetic material;
   a spacer2 layer of non-magnetic high electrical resistivity material disposed between said free layer and said keeper layer; and
   a second antiferromagnetic (AFM2) layer of NiO adjacent to said keeper layer, said AFM2 layer pinning the magnetization of said keeper layer.

22. A disk drive system, comprising:
   a magnetic recording disk;
   a spin valve (SV) magnetoresistive sensor for sensing magnetically recorded data on said magnetic recording disk, the SV sensor comprising;
      a first antiferromagnetic (AFM1) layer;
      a pinned layer adjacent to said AFM1 layer, said AFM1 layer pinning the magnetization of said pinned layer;
      a free layer of ferromagnetic material, wherein said free layer is the only free layer;
      a spacer1 layer disposed between said free layer and said pinned layer;
      a keeper layer of ferromagnetic material;
      a spacer2 layer of non-magnetic high electrical resistivity material disposed between said free layer and said keeper layer; and
      a second antiferromagnetic (AFM2) layer adjacent to said keeper layer, said AFM2 layer pinning the magnetization of said keeper layer;
   an actuator for moving said SV sensor across the magnetic recording disk so the SV sensor may access different regions of magnetically recorded data on the magnetic recording disk; and
   a recording channel coupled electrically to the SV sensor for detecting changes in resistance of the SV sensor caused by rotation of the magnetization axis of the free ferromagnetic layer relative to the fixed magnetization of the pinned layer in response to magnetic fields from the magnetically recorded data.

23. The disk drive system as recited in claim 22, wherein said AFM1 layer is made from NiO.

24. The disk drive system as recited in claim 22, wherein said AFM2 layer is made from NiO.

25. The disk drive system as recited in claim 22, wherein said keeper layer is made from Ni—Fe—Cr.

26. The disk drive system as recited in claim 22, wherein said spacer2 layer is selected from a group of materials consisting of Ta, tantalum oxide, $Al_2O_3$, and $SiO_2$.

27. The disk drive system as recited in claim 22, wherein said pinned layer further comprises:
   a first sub-layer made of cobalt or Co—Fe adjacent to said spacer1 layer; and
   a second sub-layer made of Ni—Fe (permalloy) adjacent to said first sub-layer.

28. The disk drive system as recited in claim 22, wherein said spacer1 layer is selected from a group of materials consisting of copper, gold and silver.

29. The disk drive system as recited in claim 22, wherein said pinned layer is selected from a group of materials including Ni—Fe and Ni—Fe—Co.

30. The disk drive system as recited in claim 22, wherein said free layer is made of Ni—Fe.

31. The disk drive system as recited in claim 22, wherein said AFM1 layer is made of $Ni_x$—$Mn_y$ where $40\% \leq x \leq 54\%$, $46\% \leq y \leq 60\%$, and $x+y=100\%$.

32. The disk drive system as recited in claim 22, wherein said AFM1 layer is selected from a group of materials including Fe—Mn, Pd—Mn, Pt—Mn, Pd—Pt—Mn, Ir—Mn, Rh—Mn, Ru—Mn and Cr—Mn—Pt.

33. The disk drive system as recited in claim 22, wherein said AFM2 layer is selected from a group of materials including Ni—Mn, Fe—Mn, Pd—Mn, Pt—Mn, Pd—Pt—Mn, Ir—Mn, Rh—Mn, Ru—Mn and Cr—Mn—Pt.

34. A disk drive system, comprising:
   a magnetic recording disk;
   a spin valve (SV) magnetoresistive sensor for sensing magnetically recorded data on said magnetic recording disk, the SV sensor comprising:
      a first antiferromagnetic (AFM1) layer of NiO;
      a pinned layer adjacent to said AFM1 layer, said AFM1 layer pinning the magnetization of said pinned layer;
      a free layer of ferromagnetic material, wherein said free layer is the only free layer;
      a spacer1 layer disposed between said free layer and said pinned layer;
      a keeper layer of ferromagnetic material;
      a spacer2 layer of non-magnetic high electrical resistivity material disposed between said free layer and said keeper layer; and
      a second antiferromagnetic (AFM2) layer of NiO adjacent to said keeper layer, said AFM2 layer pinning the magnetization of said keeper layer;
   an actuator for moving said SV sensor across the magnetic recording disk so the SV sensor may access different regions of magnetically recorded data on the magnetic recording disk; and
   a recording channel coupled electrically to the SV sensor for detecting changes in resistance of the SV sensor caused by rotation of the magnetization axis of the free ferromagnetic layer relative to the fixed magnetization of the pinned layer in response to magnetic fields from the magnetically recorded data.

35. A disk drive system, comprising:
   a magnetic recording disk;
   a spin valve (SV) magnetoresistive sensor for sensing magnetically recorded data on said magnetic recording disk, the SV sensor comprising:
      a first antiferromagnetic (AFM1) layer of Ni—Mn;
      a pinned layer adjacent to said AFM1 layer, said AFM1 layer pinning the magnetization of said pinned layer;
      a free layer of ferromagnetic material, wherein said free layer is the only free layer;
      a spacer1 layer disposed between said free layer and said pinned layer;
      a keeper layer of ferromagnetic material;
      a spacer2 layer of non-magnetic high electrical resistivity material disposed between said free layer and said keeper layer; and
      a second antiferromagnetic (AFM2) layer of NiO adjacent to said keeper layer, said AFM2 layer pinning the magnetization of said keeper layer;

an actuator for moving said SV sensor across the magnetic recording disk so the SV sensor may access different regions of magnetically recorded data on the magnetic recording disk; and a recording channel coupled electrically to the SV sensor for detecting changes in resistance of the SV sensor caused by rotation of the magnetization axis of the free ferromagnetic layer relative to the fixed magnetization of the pinned layer in response to magnetic fields from the magnetically recorded data.

* * * * *